US008533650B2

(12) United States Patent  (10) Patent No.: US 8,533,650 B2
Arsintescu et al.  (45) Date of Patent: Sep. 10, 2013

(54) ANNOTATION MANAGEMENT FOR HIERARCHICAL DESIGNS OF INTEGRATED CIRCUITS

(75) Inventors: Bogdan G. Arsintescu, San Jose, CA (US); Gilles S. C. Lamant, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 532 days.

(21) Appl. No.: 12/562,067

(22) Filed: Sep. 17, 2009

(65) Prior Publication Data

US 2011/0066995 A1  Mar. 17, 2011

(51) Int. Cl.
*G06F 17/50* (2006.01)
*G06F 15/04* (2006.01)

(52) U.S. Cl.
USPC ............................ 716/122; 716/125; 716/139

(58) Field of Classification Search
USPC .......................................... 716/122, 125, 139
See application file for complete search history.

(56) References Cited

U.S. PATENT DOCUMENTS

| 5,281,558 | A * | 1/1994 | Bamji et al. | 716/122 |
| 6,684,379 | B2 * | 1/2004 | Skoll et al. | 716/102 |
| 7,009,422 | B2 * | 3/2006 | Ting et al. | 326/41 |
| 7,024,427 | B2 * | 4/2006 | Bobbitt et al. | 1/1 |
| 7,617,222 | B2 * | 11/2009 | Coulthard et al. | 1/1 |
| 2002/0070756 | A1 * | 6/2002 | Ting et al. | 326/41 |
| 2005/0160390 | A1 * | 7/2005 | Bonges et al. | 716/10 |
| 2006/0095884 | A1 * | 5/2006 | Skoll et al. | 716/11 |
| 2006/0101368 | A1 * | 5/2006 | Kesarwani et al. | 716/11 |
| 2010/0058269 | A1 * | 3/2010 | Baker et al. | 716/10 |

OTHER PUBLICATIONS

"Cadence: Layout Versus Schematic (LVS) Verification", Mar. 15, 2003; Obtained from http://www.seas.upenn.edu/~eecad/cadence/lvs.html on Mar. 28, 2012; pp. 1-7.*

* cited by examiner

*Primary Examiner* — Stacy Whitmore
*Assistant Examiner* — Magid Dimyan
(74) *Attorney, Agent, or Firm* — Schwegman Lundberg & Woessner, P.A.

(57) ABSTRACT

A method is provided to produce a persistent representation of a annotation to a circuit design comprising: providing a block hierarchy that corresponds to the circuit design; displaying in a computer user interface display a first elaborated view of the circuit design that corresponds to the first instance of a block hierarchy; receiving user input to associate the annotation with a component of the elaborated view of the design; providing in a mirrored block hierarchy; and associating the annotation with the mirrored block hierarchy in computer readable storage media.

21 Claims, 13 Drawing Sheets

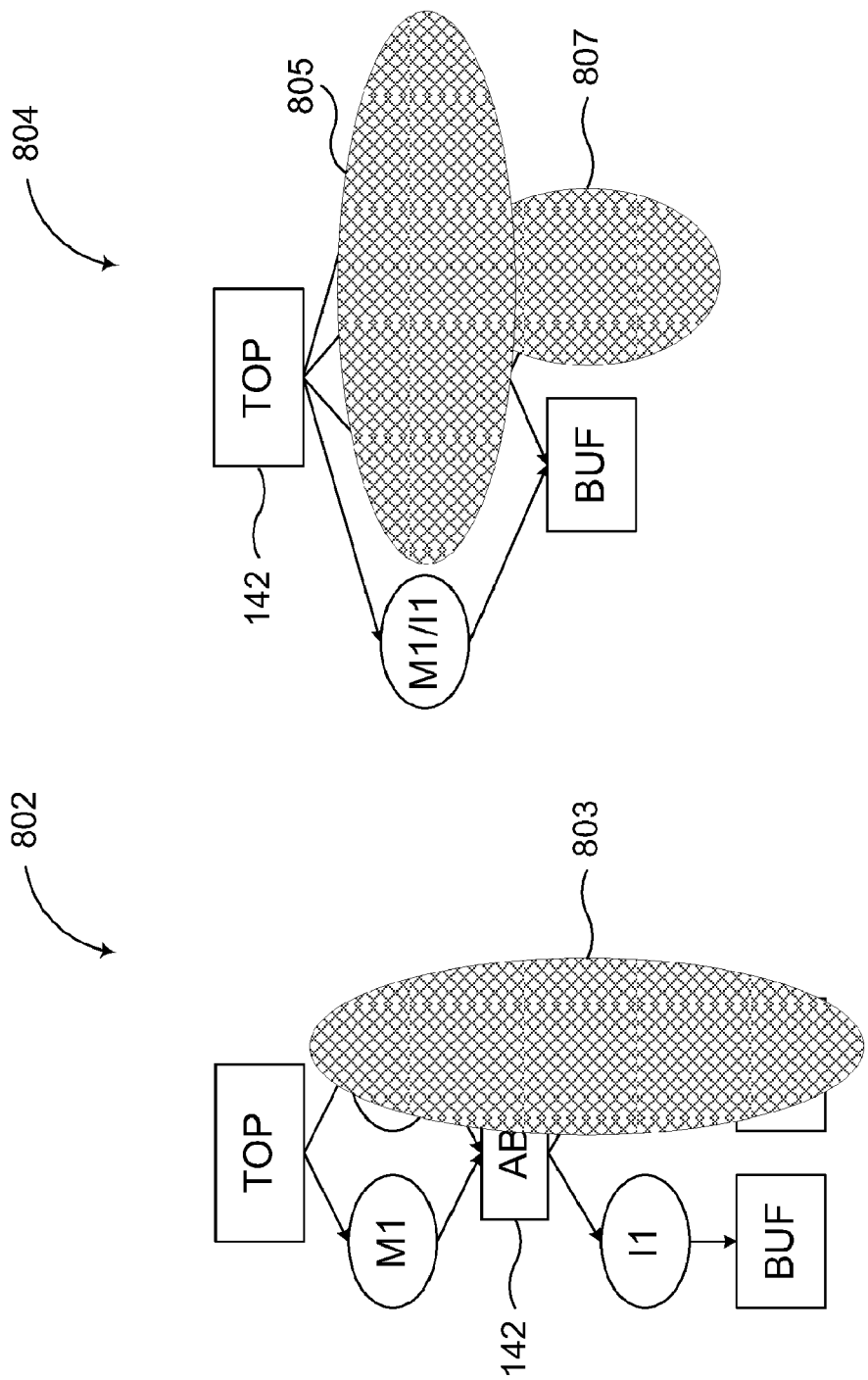

ANNOTATION MANAGEMENT FOR HIERARCHICAL DESIGNS OF INTEGRATED CIRCUITS

BACKGROUND OF THE INVENTION

1. Field of the Invention

The invention relates in general to integrated circuits and more particularly to use of annotations upon objects in a hierarchical circuit design.

2. Description of the Related Art

An 'annotation' comprises information that is added to a design. A 'constraint' refers to a category of annotation that acts as an instruction to direct another software based tool in the design flow. A constraint typically is identified, for example, by a name, which is associated with an optional value that may specify details about the constraint. A 'probe' refers to a category of annotation to direct where a measurement should be placed after a simulation event. A 'note' refers to a category of annotation used to indicate design intent and may be akin to an informal "note to self".

Constraint-driven design relates to a technique for productivity enhancement in modern design automation software. A designer may attach a constraint to one or more design 'occurrences', i.e., instantiations of an object that represents a component of a design, to specify information about a design object for the purpose, for example, of overriding default layout parameters or for providing additional layout or process parameters. Constraints to a design that can be recognized and used by computer software based design tool or fabrication process also are referred to as "constraints". As used herein, an 'edit' is distinct from a constraint. An edit refers to a change to the design, and a constraint can also be seen as a limitation or qualification on use or behavior of a component of the design.

Constraint types may include behavioral (e.g., electrical) and structural (e.g., symmetry, module generators, alignment, orientation) and physical (e.g., design-specific process rule overrides, shielding). For example, a symmetry constraint may specify that two components (e.g., transistors) are to be positioned symmetrically in the physical layout. An orientation constraint may specify that a component is to be positioned with a particular orientation, where the orientation is specified by the value of the constraint. A design tool may recognize and act on the constraints when generating the layout. The constraint also may be used in the fabrication process when fabricating the physical circuit.

During design layout, a hierarchical design is flattened down to layout stop-points, typically at leaf nodes in the design, and for each leaf node, corresponding constraints are transferred to leaf node instances that have been annotated with such constraints. Typically, modification of design schematics is not permitted when annotating constraints since many design flows impose a strict 'read-only' rules to design schematics. As a result, annotations typically have been stored in a file separate from the schematic design. However, managing the relationship between informal data (e.g., a text file storing annotations) and a changing database used to interpret a design requires increasingly complex parsing of the data and interpreting of the relationship. Tracking edits to design configurations and updating corresponding annotations to occurrences based upon those modifications requires an increasing number of details to be saved and re-interpreted.

Storing annotations for a schematic hierarchical design has been difficult to manage in part because a design hierarchy is elaborated (i.e., interpreted) at runtime, and therefore, a fully qualified path to a given 'occurrence' to which an annotation is to apply is determined dynamically. The challenge is to relate an annotation to an occurrence of a design object without actually "touching" the design object. This challenge is even more difficult since an occurrence upon which an annotation is to apply is defined dynamically by an interpreted path in a hierarchy of design, and the actual occurrence comprises a hierarchical collection of designs on the path.

Therefore, there has been a need for improvements in the storage and management of annotations applied to occurrences within a hierarchical design. The present invention meets this need.

SUMMARY OF THE INVENTION

A method is provided to produce a persistent representation of an annotation to a circuit design. A first instance of a block hierarchy is provided that corresponds to the circuit design. A first elaborated view of the circuit design that corresponds to the first instance of the block hierarchy is displayed in a computer user interface display. User input requests that the annotation be associated with a component of the elaborated view of the design. A mirrored block hierarchy is provided, and the annotation is associated with the mirrored block hierarchy in computer readable storage media.

Later, a second instance of the block hierarchy corresponding to the design may be provided, and the occurrence in the mirrored block hierarchy can be mapped to a corresponding occurrence in the second instance of the block hierarchy. The annotation is associated with the corresponding occurrence in the second instance of the block hierarchy, and a second elaborated view of the circuit design including annotation is associated with the component, is displayed on a computer display screen.

In some embodiments, providing the mirrored block hierarchy involves creating a mirrored module hierarchy that mirrors a folded module hierarchy that unfolds to instantiate the first instance of the block hierarchy. The mirrored module hierarchy is transformed to the mirrored block hierarchy. The mirrored module hierarchy unfolds to instantiate an occurrence within the first instance of the block hierarchy that corresponds to the component to be associated with the annotation. The mirrored module hierarchy omits a portion of the folded module hierarchy that unfolds to instantiate an occurrence within the first instance of the block hierarchy that does not corresponds to the component to be associated with the annotation. Accordingly, transformation of the mirrored module hierarchy to the mirrored block hierarchy results in the mirrored block hierarchy that includes the occurrence within the first instance of the block hierarchy that corresponds to the component to be associated with the annotation, and that omits an occurrence within the first instance of the block hierarchy that does not correspond to the leaf component to be associated with the annotation.

These and other features and advantages of the invention will be apparent from the following description of embodiments thereof in conjunction with the drawings.

BRIEF DESCRIPTION OF THE DRAWINGS

FIGS. 8A-8B show an example partial mirrored module hierarchy (FIG. 8A) and partial mirrored block hierarchy (FIG. 8B) that result when an annotation is added to a component of one instance of a folded module within a design but not to a corresponding instance of the same component in a different instance of that same folded module.

DETAILED DESCRIPTION OF THE EMBODIMENTS

Figure 1A:
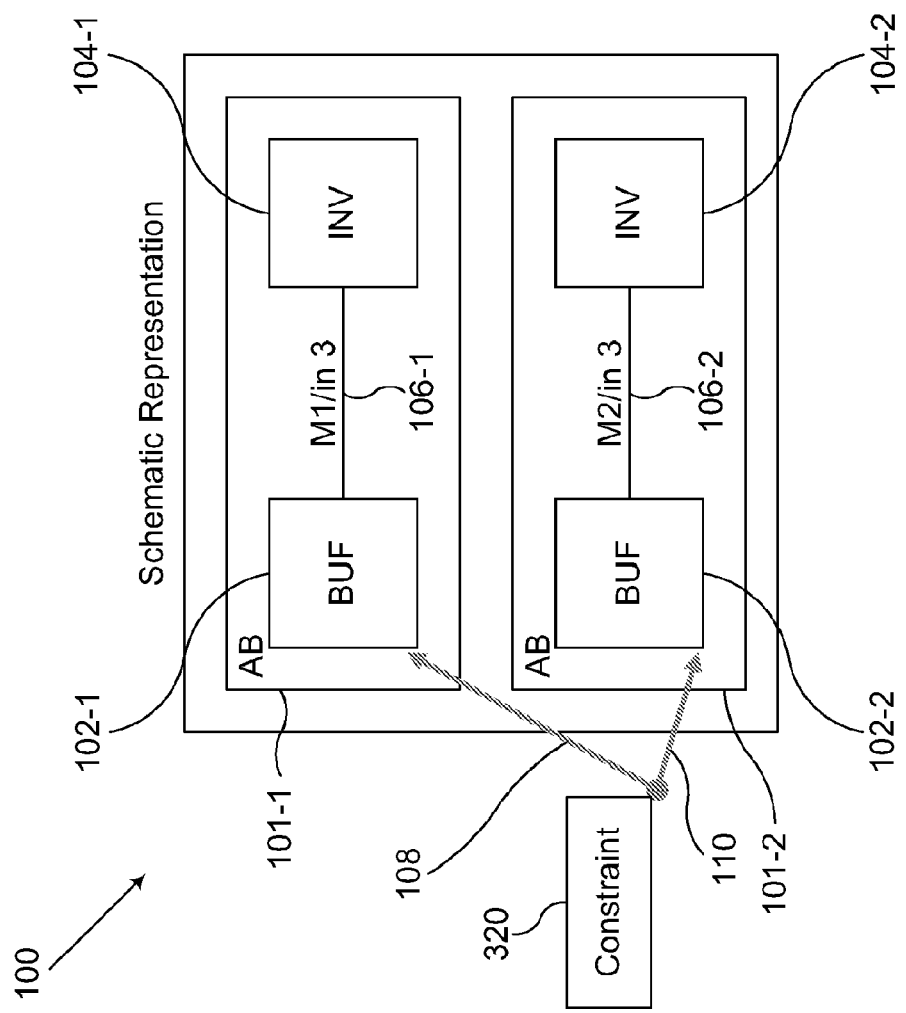
FIG. 1A is an illustrative schematic diagram of a 'flat' representation of a circuit design.

The following description is presented to enable any person skilled in the art to store annotations upon elements of a hierarchical integrated circuit design in accordance with embodiments of the invention and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that embodiments of the invention might be practiced without the use of these specific details. In other instances, well-known structures and processes are shown in block diagram form in order not to obscure the description of the embodiments with unnecessary detail. Thus, the present invention is not intended to be limited to the embodiments shown, but is to be accorded the widest scope consistent with the principles and features disclosed herein As used herein a 'design' refers to a logical container of the objects stored in a computer readable storage medium representing some logical portion of a circuit. Design objects at a higher level in a multi-level design hierarchy 'contain', i.e., reference, design objects at lower levels of the design hierarchy. Higher level design objects typically provide a more abstract view of the structure and functionality of a circuit represented by the design, and lower level design objects referenced by such higher level design objects provide additional details of the circuit implementation.

The 'top' level of a design hierarchy comprises the entire hierarchical collection of objects that describe a circuit design in detail. 'Elaborating' or 'resolving' or 'unfolding' a design typically involves traversing a design hierarchy by following references within higher level design objects to lower level design objects. Following a reference to a design object at a lower level in the hierarchy involves retrieval of that referenced design object from a design database or library. The process of traversal down the hierarchy continues until reaching a 'primitive frontier', the lowest level of hierarchy or "leaf" level.

As used herein, the term 'leaf' refers to an object in a design that is instantiated into a design hierarchy from a cell library, for example, and that has an internal description that is not traversed in the course of resolving the design hierarchy into its constituent parts. Leaf cells are sometimes synonymous with "gates" (such as AND, OR, XOR, etc.) but also may represent more primitive building block devices such as resistors and capacitors. Conversely, however, more complex logical functions, such as flip-flops, multipliers or filters can be instantiated into a larger design from a cell library as "cores", essentially leaf cells, that are invisible inside and are merely characterized by their behaviors and electrical characteristics. A copy of a leaf cell is included in a design as many times as it used in the design.

As used herein an "occurrence" refers to a unique full path through a design from the "top" design level of a design hierarchy to a leaf instance at the lowest level of the hierarchy.

An 'embedded module hierarchy (EMH)' as used herein includes both a folded module hierarchy and a corresponding block hierarchy for a given design. Details of implementation of the EMH are provided in "Si2 OpenAccess API Tutorial, Eighth Edition (OA 2.2 DM4)" Release 1.0, Silicon Integration Initiative, Inc., 9111 Jollyville Rd., Suite 250, Austin, Tex., copyright 2004-2008, chapters 10-13, which is expressly incorporated herein by this reference. In some embodiments, an object-oriented programming paradigm or design methodology is used to produce the design hierarchy. An object-oriented programming paradigm typically is characterized by the use of objects that send messages to each other. As used herein, 'objects' refer to instantiations of hierarchically organized classes that represent computer program data. Messages are implemented via functions that communicate data via parameters and sometimes return values. Object oriented programming is data-centric in contrast to procedural or functional programming paradigms.

FIG. 1A is an illustrative schematic diagram of a 'flat' representation of a circuit design 100. In a flattened representation of a design, a separate copy of each design component is replicated everywhere that it is used in the design. The circuit design 100 logically includes two circuit block objects named 'AB' each consisting of a buffer, an inverter and a net connecting them. Each occurrence of the AB circuit block object has its own geometric placement in the circuit 100. A first AB circuit block 101-1 includes a first buffer 102-1, a first inverter 104-1 and a first net 106-1 interconnecting them. A second AB circuit block 101-2 includes a second buffer 102-2, a second inverter 104-2 and a second net 106-2 interconnecting them. Arrows 108 and 110 indicate user command input to annotate buffers 101-1 and 101-2 with an annotation, a constraint 320 in this example, which is discussed in detail below.

Figures 1B, 1C:
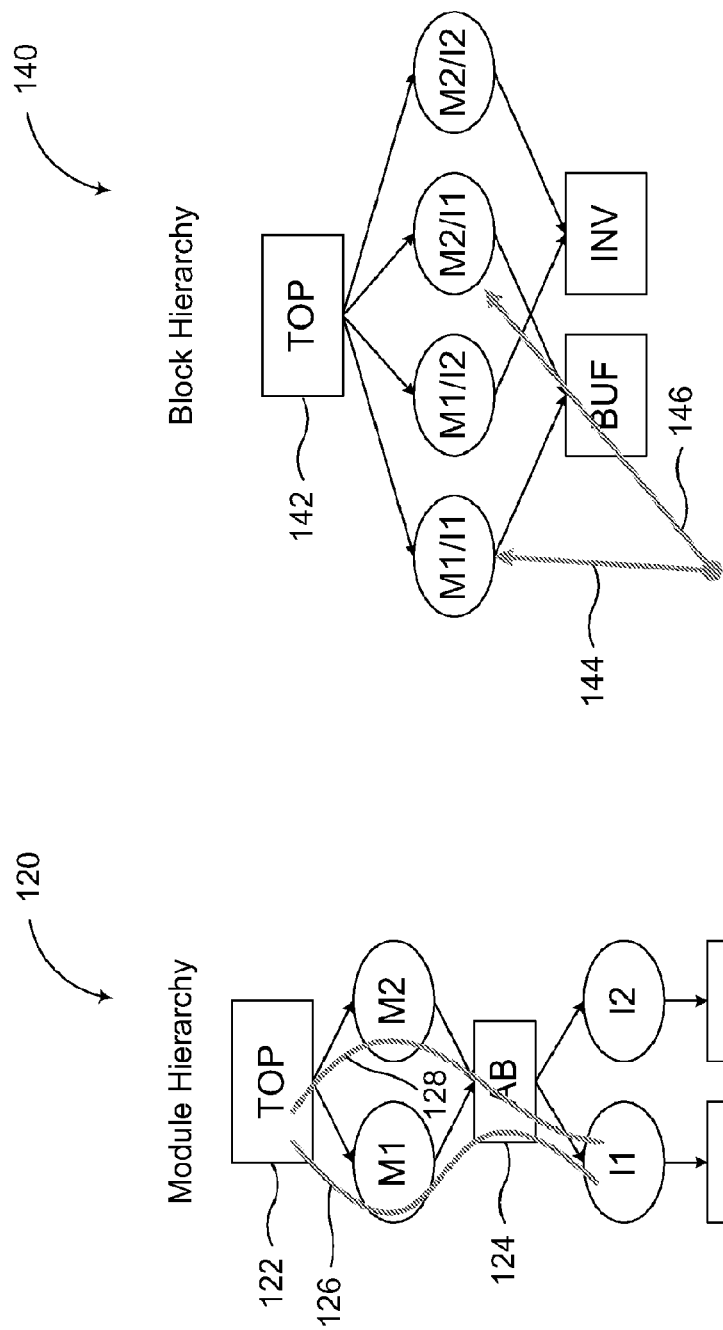
FIG. 1B is an illustrative drawing of a folded module hierarchy representing the circuit design of FIG. 1A.
FIG. 1C is an illustrative drawing of a block hierarchy representing the circuit design of FIG. 1A.

FIG. 1B is an illustrative drawing of a folded module hierarchy 120 representing the circuit design 100 of FIG. 1A.

In a 'folded' hierarchical model, common representation details of two or more instances of the same kind are "folded" onto one design definition. As used herein, 'folding' refers to a logical abstraction of reuse of a subset of design data via reference. It will be appreciated that the folded module hierarchy 120 comprises a data structure that is stored in a computer readable storage medium. The use of a folded module hierarchy permits more efficient use of computer readable storage media and efficient reuse of design data since a single reference to a design block may be used to refer to multiple instantiations of the design block. The module hierarchy includes a 'top' design block 122, which is at the root of the folded module hierarchy. The top design block 122 references instances M1 and M2 of a design block named 'AB'. Instance M1 of the AB design block 124 corresponds to the first AB circuit block 101-1 of FIG. 1A, and instance M2 of the AB design block 124 corresponds to the second AB circuit block 101-2 of FIG. 1A. Note that the AB design block 124 is 'folded' in that it is referenced by multiple instances, i.e. M1 and M2. The AB design block 124 includes references to instances I1 and I2. Instance I1 is an instance of a buffer cell named BUF, and instance I2 is an instance of an inverter cell named INV. In some embodiments, the buffer cell and the inverter cell are leaf cells. Traversal paths 126 and 128 within the module hierarchy 120 proceed from the top design 122 to design module AB and then to instance I1 (BUF), which is separately instantiated for each instances M1 and M2 of module AB to realize the two buffers 101-1 and 101-2.

FIG. 1C is an illustrative drawing of a block hierarchy 140 representing the circuit design 100 of FIG. 1A. In the block hierarchy of FIG. 1C, the hierarchical instances of modules M1, M2 and I1, I2 of FIG. 1B have been unfolded to instantiate separate instances of the buffer cell M1/I1, M2/I1 and into separate instances of the inverter cell M1/I2, M2/I2. Stated differently, the AB design block 124 of FIG. 1B has been unfolded to instantiate occurrences M1/I1 and M1/I2, which corresponds to a first instance of the AB design block and into occurrences M2/I1 and M2/I2, which corresponds to a second instance of the AB design block. It will be appreciated that the block hierarchy 140 comprises a data structure that is stored in a computer readable storage medium. A different respective block hierarchy occurrence is associated with each different leaf instance in the block hierarchy. The first occurrence M1/I1 corresponds to buffer 102-1 in the schematic circuit 100 of FIG. 1A. The second occurrence M2/I1 corresponds to buffer 102-2 in the circuit 100. The third occurrence M1/I2 corresponds to inverter 104-1 in the circuit 100. The fourth occurrence M2/I2 corresponds to inverter 104-2 of the circuit 100. Thus, the block hierarchy includes a different respective instance of a leaf cell (i.e. BUF or INV) for each occurrence of a corresponding circuit element in the flattened representation of the circuit 100. Arrows 144 and 146 indicate that the first and third occurrences, M1/I1 and M2/I1, in the block hierarchy 140, which correspond to the two buffers 101-1 and 101-2.

Thus, an EMH for the circuit schematic 100 of FIG. 1A, for example, includes both the folded module hierarchy 120 of FIG. 1B and the block hierarchy 140 of FIG. 1B. During development of an integrated circuit design in accordance with some embodiments of the invention, any edits to the circuit design typically will be made in the module domain (i.e., module hierarchy), and any annotations upon a circuit design will be made in the block domain (i.e., block hierarchy). Making edits to the folded module domain ensures that changes to a folded module within design propagate to all instances of that module when the design is elaborated. Conversely, making annotations to the block domain allows for association of an annotation with a particular selected instance of a component that may be instantiated multiple times within the design block.

Figure 2:
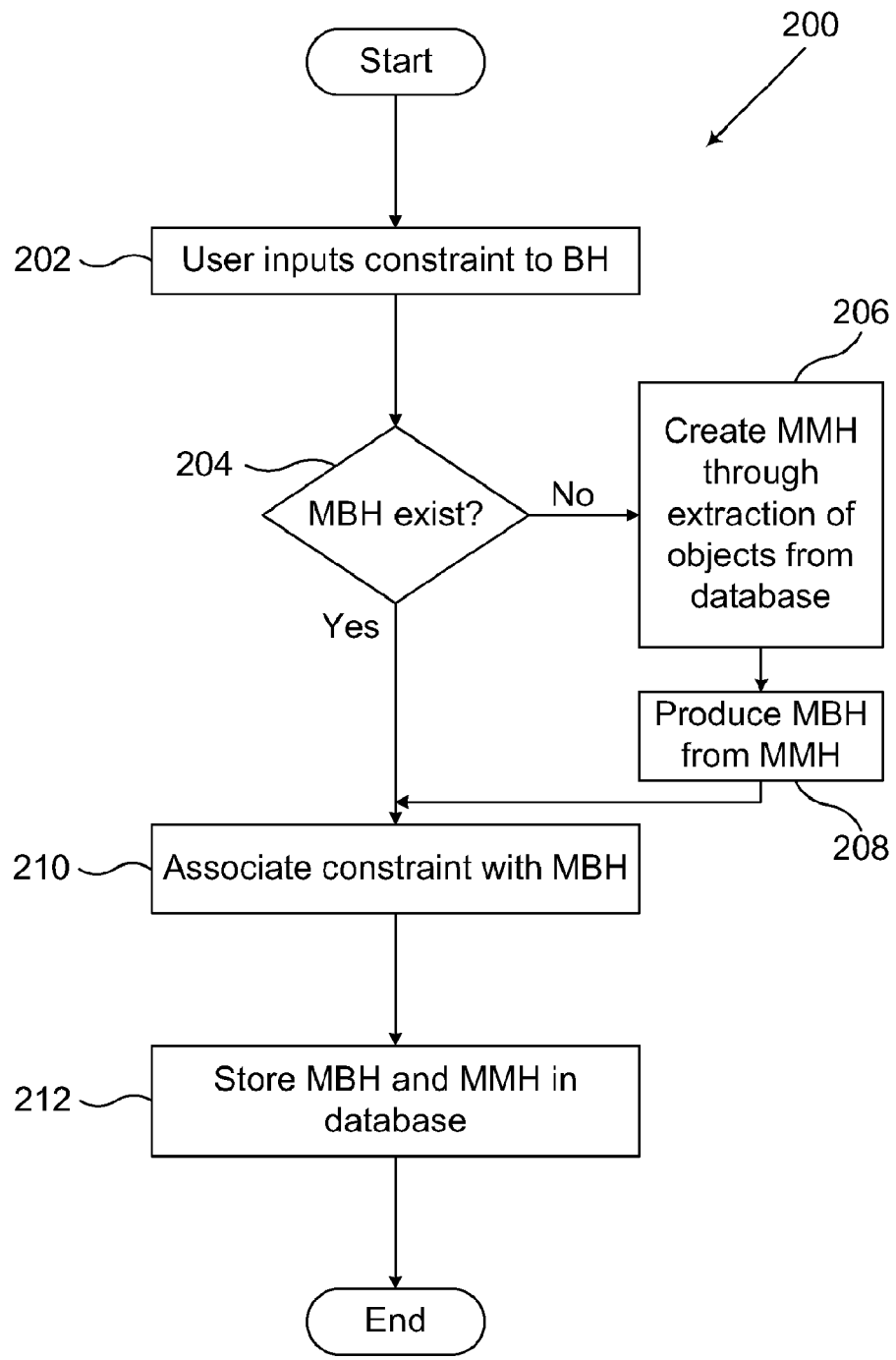
FIG. 2 is an illustrative flow diagram of a process to produce a partial mirrored module hierarchy and a corresponding partial mirrored block hierarchy in accordance with some embodiments of the invention.
Figure 10:
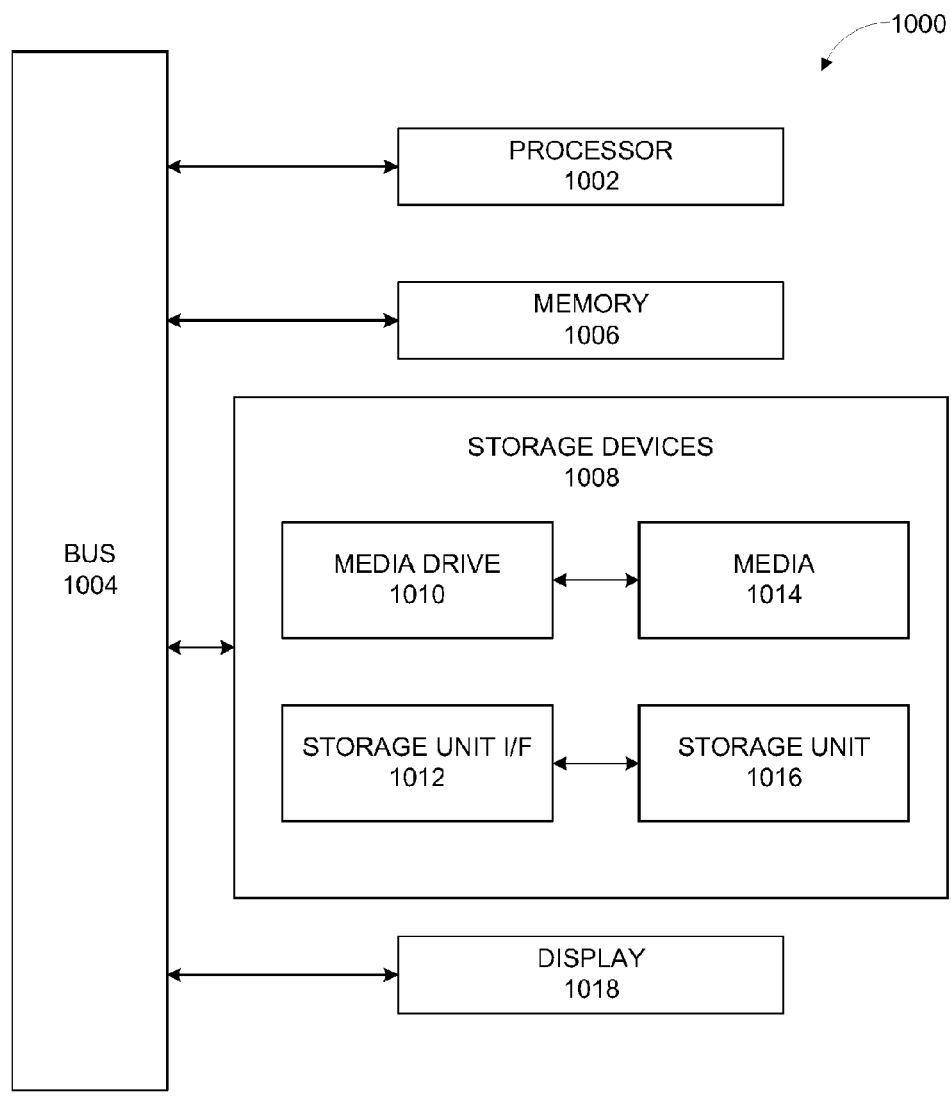
FIG. 10 is an illustrative block level diagram of a computer system that can be programmed to store constraints in association with partial mirrored module hierarchy and to map occurrences associated with the stored annotations in a partial mirrored block hierarchy with corresponding instances within an original block hierarchy in accordance with some embodiments of the invention.

FIG. 2 is an illustrative flow diagram of a process 200 to produce a mirrored module hierarchy and a corresponding mirrored block hierarchy in accordance with some embodiments of the invention. Machine readable program code is stored in machine readable storage media, such as DRAM, SRAM or Disk storage, to configure a computer system to perform the illustrated process. A processor such as that described with reference to FIG. 10 is configured according to machine readable program code stored in machine readable storage media to perform the process 200. The flow diagram of FIG. 2 includes a plurality of program portions, each representing an aspect of the process that configures the processor to perform a specified function of such program portion.

Figure 4:
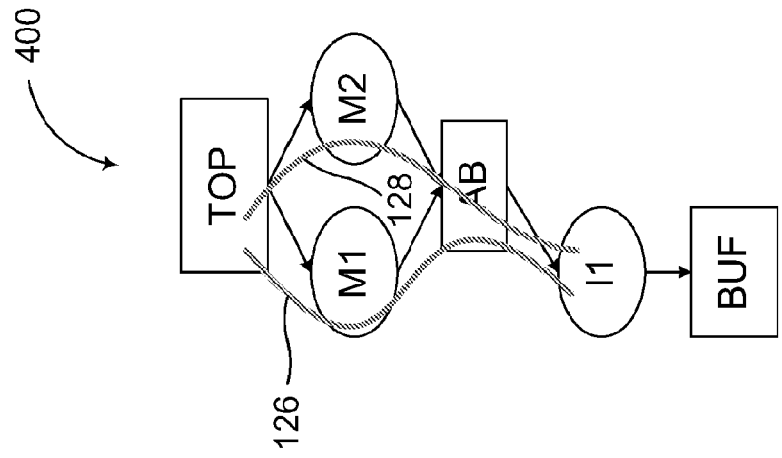
FIG. 4 is a partial mirrored module hierarchy which is a transformation of the folded module hierarchy of FIG. 1B based upon the annotations added to the block hierarchy of FIG. 3.
Figure 3:
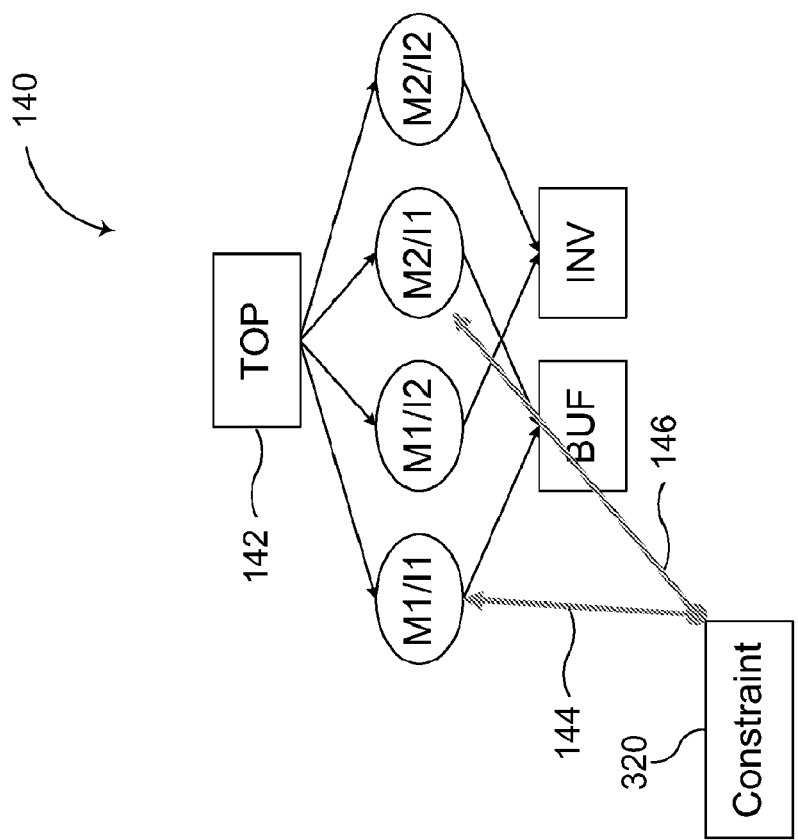
FIG. 3 is an illustrative drawing of the hierarchy of FIG. 1C with annotations associated with two occurrences within the hierarchy.
Figure 5:
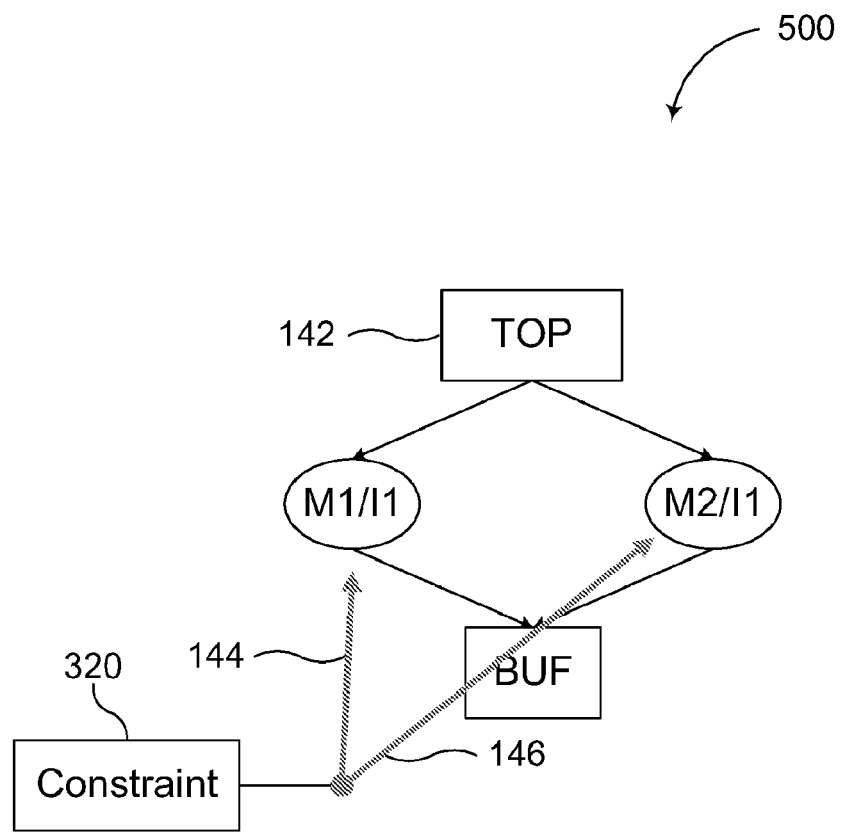
FIG. 5 is an illustrative drawing of a partial mirrored block hierarchy produced from an unfolding of the partial mirrored module of FIG. 4.

The process of FIG. 2 will be described with reference to an example of annotation of design components with a constraint as illustrated through the drawings of FIGS. 3, 4 and 6. FIG. 3 is an illustrative drawing of the hierarchy of FIG. 1C with constraint information associated with two occurrences within the hierarchy. Arrows 144 and 146 represent association of the constraint 320 with occurrences M1/I1 and M2/I1 of the block hierarchy of FIG. 3. The association may for example comprise a pointer or reference other indicia of association. FIG. 4 is a partial mirrored module hierarchy, which is a transformation of the folded module hierarchy of FIG. 1B that includes traversal paths 126 and 128 through the partial mirrored hierarchy from top to buffer instance I1. FIG. 5 is an illustrative drawing of a partial mirrored block hierarchy produced from an unfolding of the partial mirrored module of FIG. 4.

In program portion 202, a circuit designer input command is received through a computer user interface to add a constraint to a component of a design. In some embodiments a user is presented with a computer generated visual display of an elaborated or flattened view of a circuit design. Referring back to the example design of FIGS. 1A-1C, the block hierarchy 140 is represented in a computer user interface screen display as an elaborated schematic design 100. Components within the flattened view correspond to occurrences within a block hierarchy representation of the circuit design. By inputting a command to an annotation with one or more leaf components of the schematic design representation, a user indicates a desire to associate the annotation with a corresponding occurrence of the block hierarchy used to instantiate that component in the schematic. In this example, the user inputs a command indicating that leaf components 101-1 and 101-2, i.e., buffers, are to be associated with the constraint labeled 320.

In decision program portion 204, a determination is made as to whether a mirrored block hierarchy already exists (i.e., whether a mirrored block hierarchy was created previously) that includes occurrences corresponding to buffers 101-1 and 101-2, which the user has annotated. If a determination is made in program portion 204 that no such mirrored block hierarchy was created previously and that no such mirrored hierarchy block already exists then in program portion 206, a mirrored module hierarchy corresponding to the annotated design is extracted from the design database used to create block hierarchy.

More particularly, program portion 206 transforms an instance of the folded module hierarchy 120 of FIG. 1B to a partial mirrored module hierarchy 400 of FIG. 4 that minors those parts of the folded module hierarchy 120 that unfold to instantiate the one or more occurrences that are to be associated with the example constraint 320. The mirrored hierarchy 400 is referred to as 'partial' because it that omits portions of the folded module hierarchy 120 that do not unfold to instantiate the occurrences that have been associated with the constraint 320.

For example, buffers 101-1 and 101-2 of the schematic 100 of FIG. 1A correspond to occurrences M1/I1 and M2/I1 of the block hierarchy 140 of FIG. 3. Assuming that a mirrored block hierarchy had not been created previously, then in response to receipt of a user command to annotate the buffers 101-1 and 101-2 with constraint 320, program portion 1006 causes creation of the partial mirrored module hierarchy 400 of FIG. 4.

Next, in program portion 208, the created mirrored module hierarchy is unfolded to create a corresponding mirrored block hierarchy. For example, referring to FIG. 5, partial mirrored block hierarchy 500, which includes occurrences M1/I1 and M2/I1, is created from the unfolding of the mirrored module hierarchy 400 of FIG. 4. The mirrored block hierarchy is 'partial' in that it omits occurrences M1/I2 and M2/I2.

Program portion 210 associates the user inputted constraint with the mirrored block hierarchy resulting from program portion 208. Referring to FIG. 5, for example, constraint 320 is shown associated with the occurrences M1/I1 and M2/I1 of partial mirrored block hierarchy 500. Program portion 212 stores the modified module hierarchy 400 and the modified block hierarchy 500 in a design database in computer readable storage media. Note that storage of the mirrored module hierarchy is an inherent property of the OpenAccess database of an embodiment described herein, although such stored mirrored module hierarchy is not used again once the mirrored block hierarchy has been created and stored. Thus, a mirrored module hierarchy and a mirrored block hierarchy are created that can be stored so as to keep a persistent record of the constraint and its mapping to the elaborated design. The mirrored block hierarchy and the mirrored module hierarchy can be stored more efficiently since they are 'partial' in that they omit parts of the respective block and module hierarchies that do not correspond to the occurrence (or occurrences) within the block hierarchy that has been annotated by the designer.

It will be appreciated that the design represented by FIGS. 1B-1C, for example, may be instantiated multiple times within a larger design (not shown). A constraint stored pursuant to the process of FIG. 2 is propagated to all instances of the design module within the larger design. Continuing with the above example, the constraint 320 upon the buffers corresponding to occurrences M1/I1 and M2/I1 of FIG. 1C is propagated to every instance of M1/I1 and M2/I1 throughout a larger overall design. Thus, a user need only annotate a given component or set of components of one instance of a design module, and a constraint represented by such annotation will be associated with the instance of that component in every instance of the design module within the design.

Note that program portion 210 stores the mirrored block hierarchy 400 of FIG. 4 and the mirrored block hierarchy 500 of FIG. 5 in the same database used to store the original folded module hierarchy 120 of FIG. 1B. The mirrored module hierarchy 400 and the original folded module hierarchy 140 comprise object oriented data structures that reference the same design modules. Therefore, both mirrored block hierarchy 500 of FIG. 5 resolved from mirrored module hierarchy 400 of FIG. 4 and the original block hierarchy 140 of FIG. 1C resolved from original folded module hierarchy 120 of FIG. 1B are resolved using the same stored design AB block stored in that database. Thus, edits to design block AB are manifested in both a block hierarchy produced through the unfolding of the module hierarchy containing design AB and in a mirrored block hierarchy produced through the unfolding of the mirrored module hierarchy containing design block AB, for example.

Figure 6:
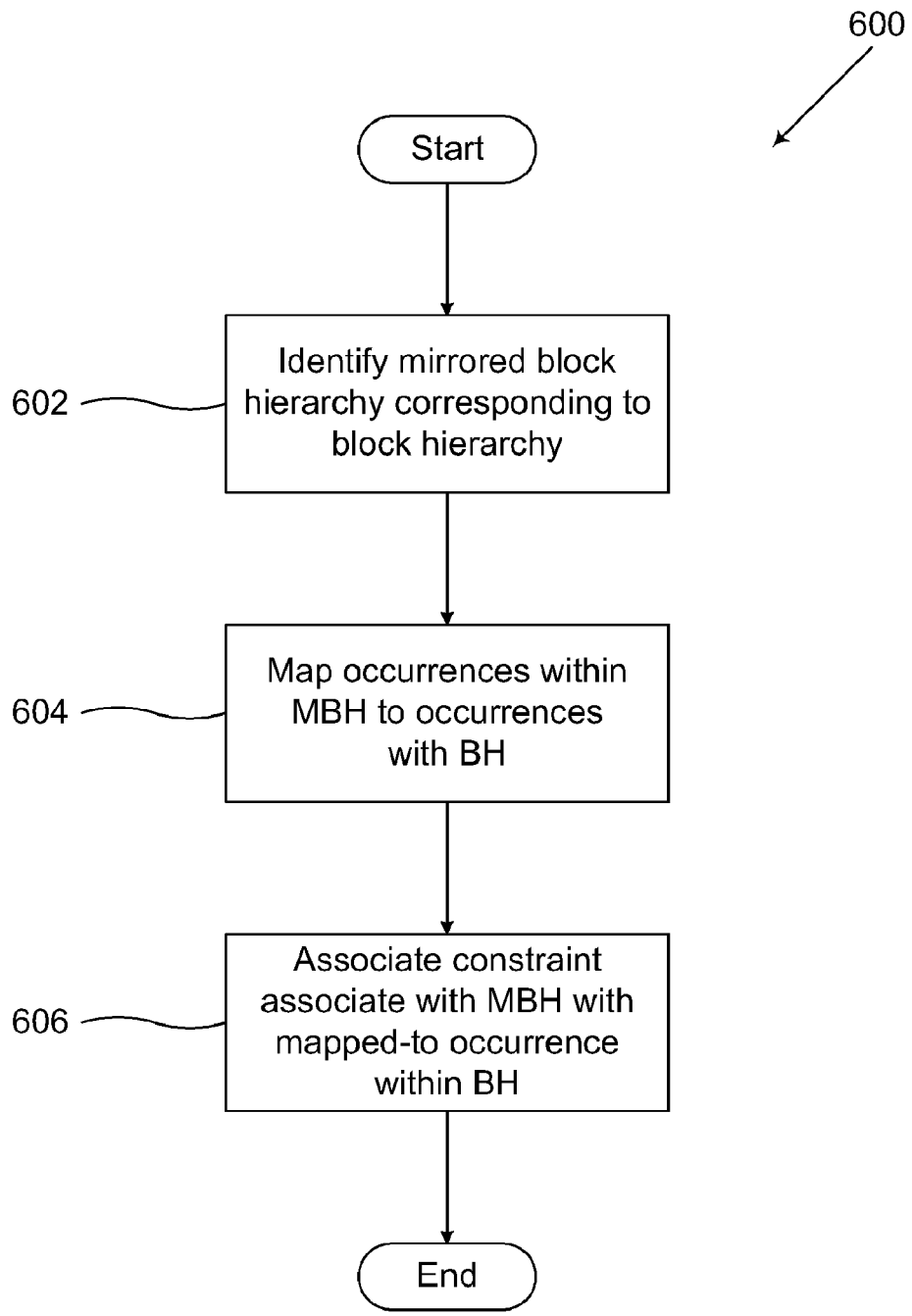
FIG. 6 is an illustrative flow diagram of a process to map a mirrored block hierarchy to a block hierarchy representing a design.

FIG. 6 is an illustrative flow diagram of a process 600 to map a mirrored block hierarchy to a block hierarchy representing a design. The mirrored block hierarchy to be mapped may be created using the process 200 of FIG. 2. Different designers may annotate a design independently of each other at different times and in different physical locations. Although these designers collaborate in developing a design with its annotations, they may work at different times and in different places. Thus, subsequent to the creation and storage of a constraint in association with a mirrored block hierarchy by a designer, for example, the same or a different designer may create another instantiation of the block hierarchy and another corresponding display of the elaborated circuit schematic. The process of FIG. 6 operates to use the previously stored mirrored block hierarchy to overlay the previously created constraint onto such new instantiation of the block hierarchy so that the constraint can be displayed in association with the elaborated schematic design.

Machine readable program code is stored in machine readable storage media to configure a computer system to perform the illustrated process 600. A processor such as that described with reference to FIG. 10, is configured according to machine readable program code stored in machine readable storage media to perform the process 600. The flow diagram of FIG. 6 includes a plurality of program portions, each representing an aspect of the process that configures the processor to perform a specified function of such program portion.

The process of FIG. 6 runs in the course of an instantiation of the block hierarchy used to produce a screen display of an elaborated design. Program portion 602 identifies a mirrored block hierarchy that corresponds to the newly instantiated block hierarchy. Program portion 604 maps occurrences in the identified mirrored block hierarchy to corresponding occurrences in the newly instantiated block hierarchy. Program portion 606 associates a constraint associated with the occurrence of the mirrored block hierarchy with a mapped-to occurrences in the block hierarchy so that the constraint can be displayed in association with a computer screen display showing an elaborated schematic design.

Figure 7:
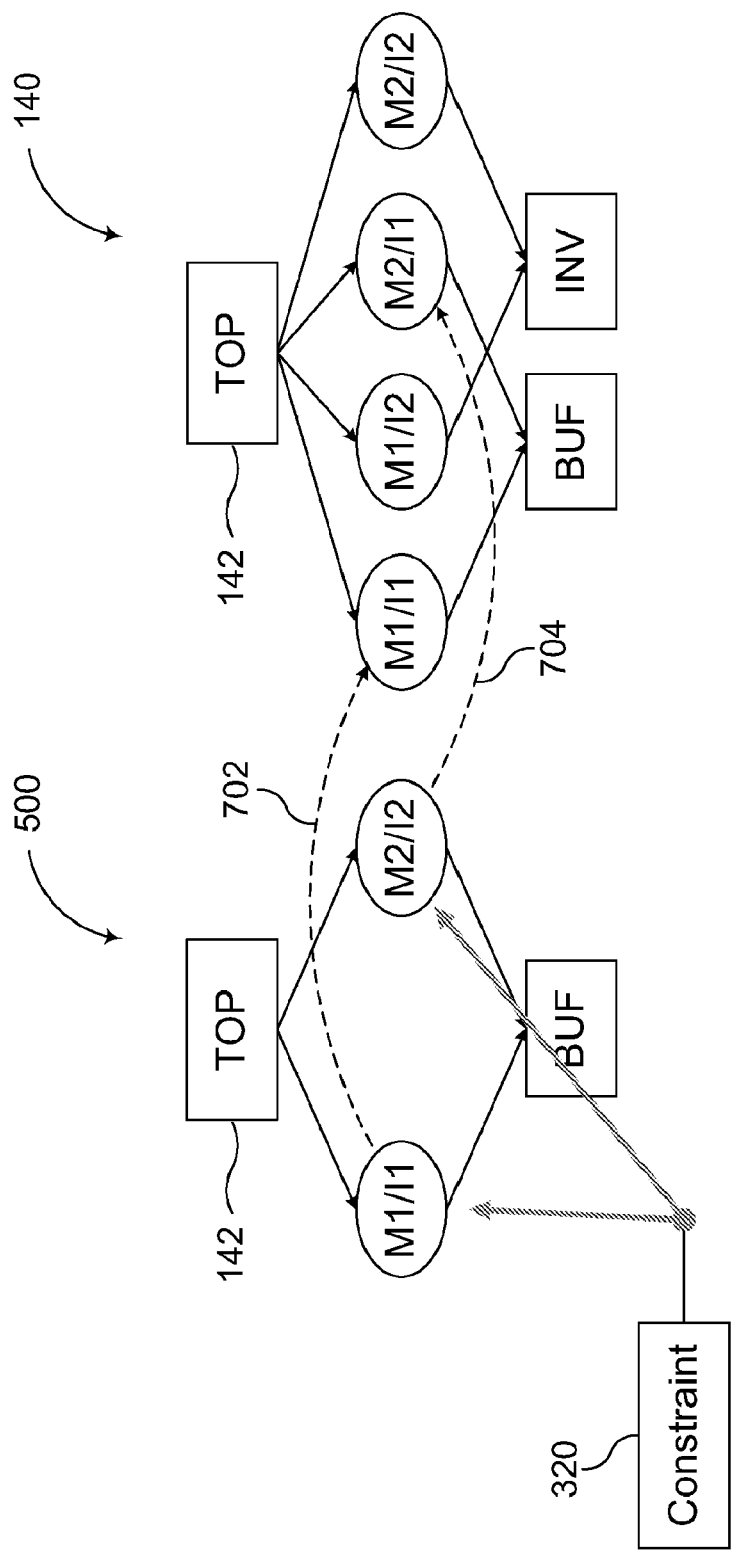
FIG. 7 is an illustrative drawing showing a mapping between the partial mirrored block hierarchy of FIG. 5 and an original block diagram of FIG. 1A.

Continuing with the above example and referring to FIG. 7, there is shown an illustrative drawing showing a mapping between the representing a previously created mirrored block hierarchy 500 of FIG. 5 and an original block hierarchy 140 of FIG. 1A. The mirrored block hierarchy 500 and the original block hierarchy 140 have been stored separately as a result of the process of FIG. 2 as described above. The Program portion 602 identifies mirrored block hierarchy 500 as corresponding to block hierarchy 140. Program portion 604 maps occurrences in the identified mirrored block hierarchy 500 to corresponding occurrences in the newly instantiated block hierarchy 140. Dashed line 702 shows a mapping between occurrence M1/I1 of mirrored block hierarchy 500 and occurrence M1/I1 of block hierarchy 140. Dashed line 704 shows a mapping between occurrence M2/I1 of mirrored block hierarchy 500 and occurrence M2/I1 of block hierarchy 140. Program portion 606 associates the constraint 320 with the occurrences M1/I1 and M2/I1 of the newly instantiated block hierarchy 140.

FIGS. 8A-8B show an example mirrored module hierarchy 802 (FIG. 8A) and mirrored block hierarchy 804 (FIG. 8B) that result when a constraint is added to a component of one instance of a folded module within a design but not to a different instance of the same component in a that same folded module. In this example, assume that a constraint has been applied only to buffer 101-1 but not to buffer 101-2 shown in FIG. 1A. In order to store the constraint, the process 200 of FIG. 2 transforms the folded module hierarchy of FIG. 1B to the mirrored module hierarchy of FIG. 8A. The shaded oval 803 represents portions of the original folded module hierarchy 120 of FIG. 1B omitted from the mirrored module hierarchy 802. Note that instance M2 of the AB block 124 is omitted from the mirrored block hierarchy 802 of FIG. 8A. In order to map the stored constraint to an instance of the design, the process 200 of FIG. 2 transforms the modified module hierarchy 802 of FIG. 8A to the mirrored block hierarchy 804 of FIG. 8B, which includes only a single occurrence M1/I1 that corresponds to the BUF leaf cell 101-1. As explained above with reference to FIG. 1C, the first occurrence consists of a path from a top design block to the instance M1/I1 of the buffer cell BUF. The shaded ovals 805, 807 represents portions of the original block hierarchy 140 of FIG. 1C omitted from the mirrored block hierarchy 804.

Figure 9A:
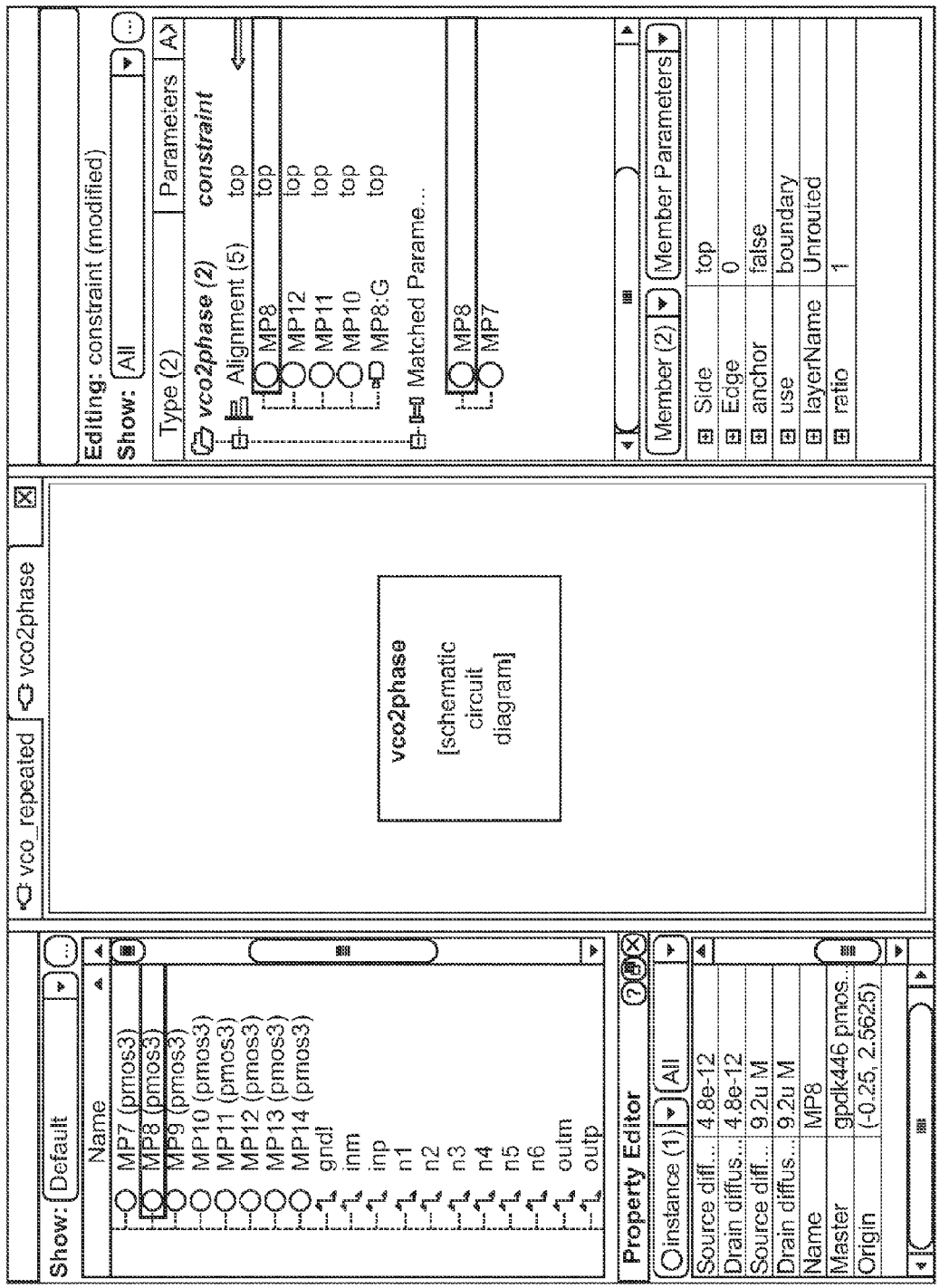
FIGS. 9A-9D are illustrative drawings of computer user interface screen displays before (FIGS. 9A and 9C) and after (FIGS. 9B and 9D) user annotation of a design.
Figure 9B:
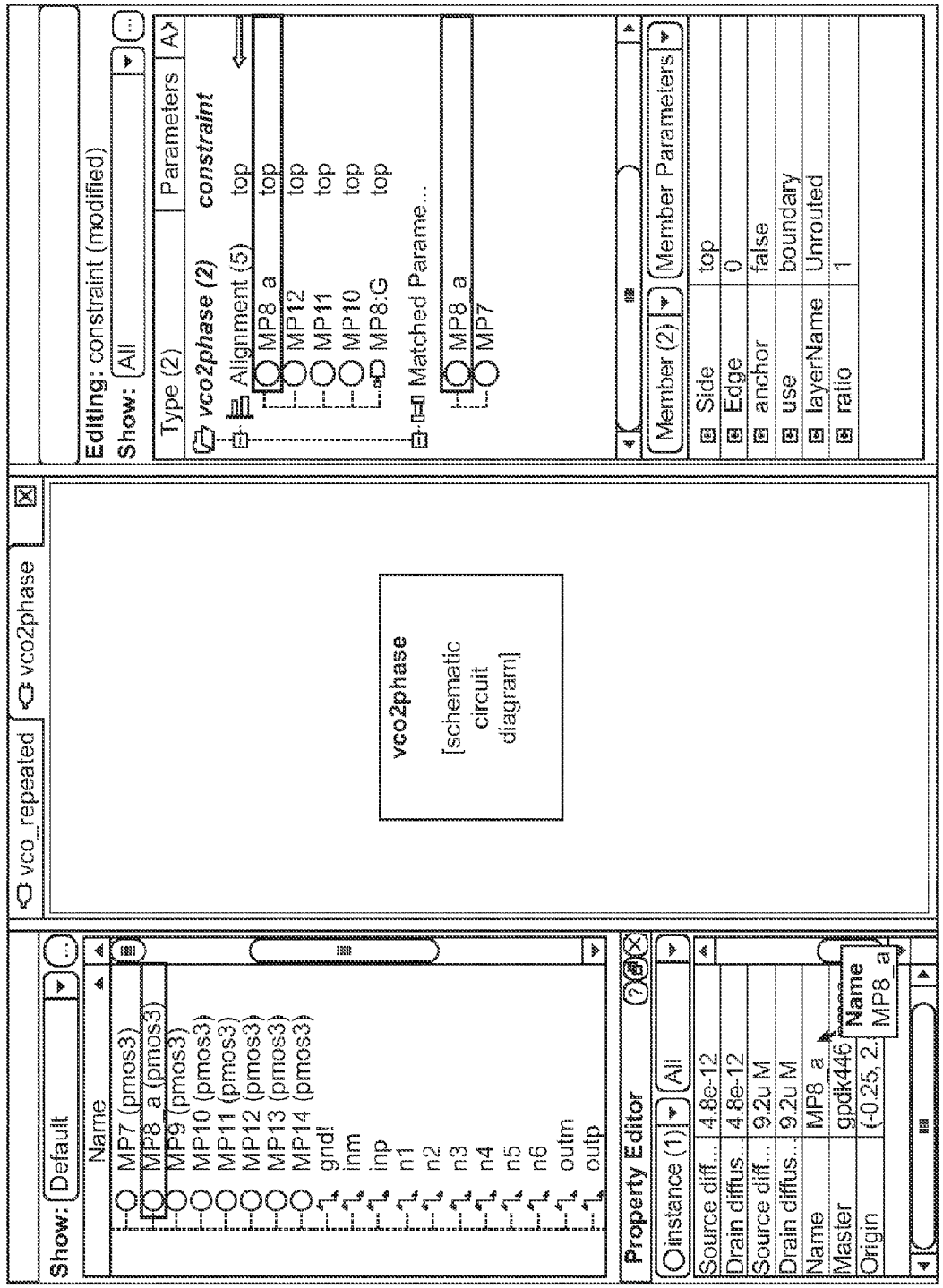
Figure 9C:
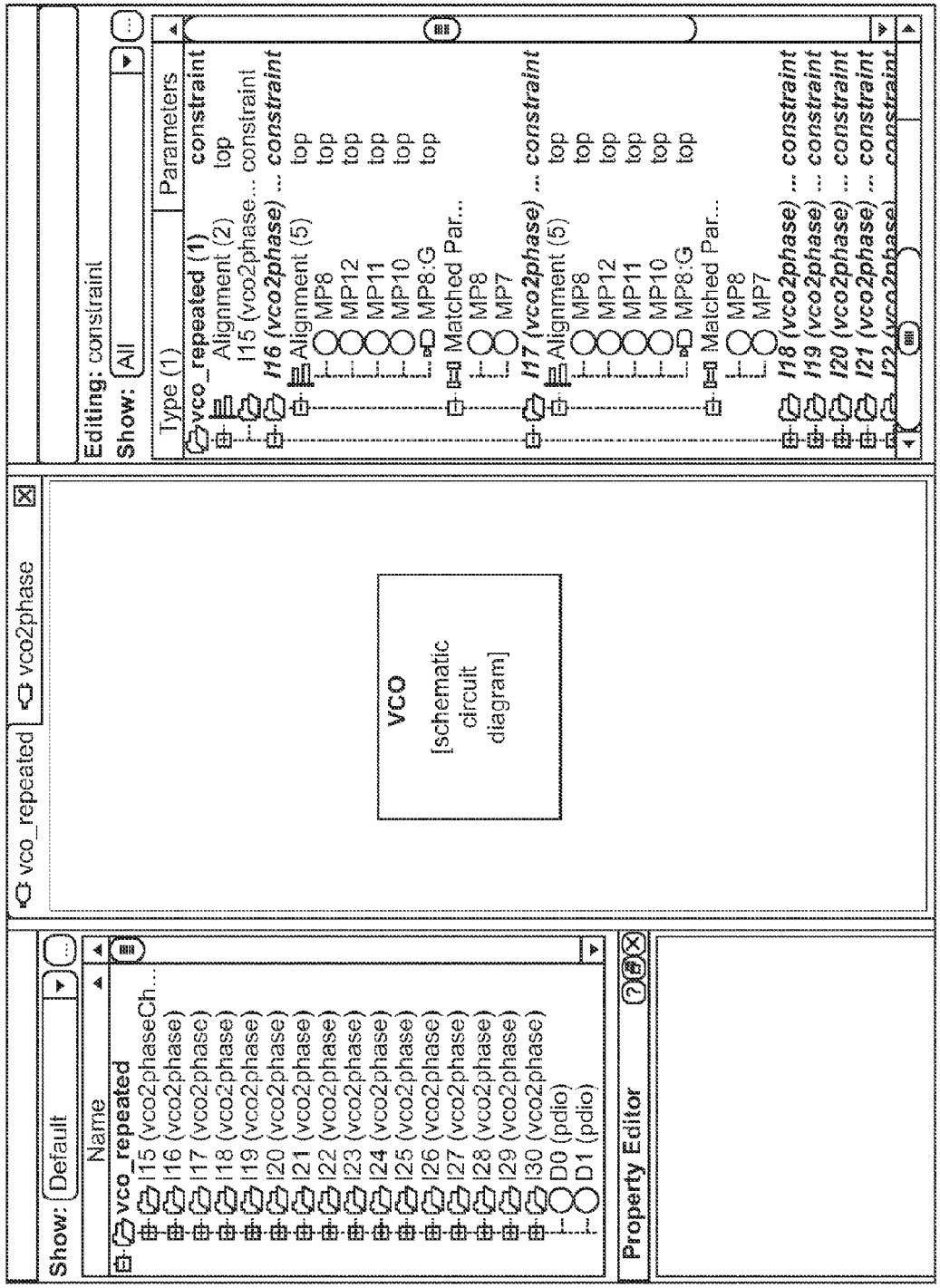
Figure 9D:
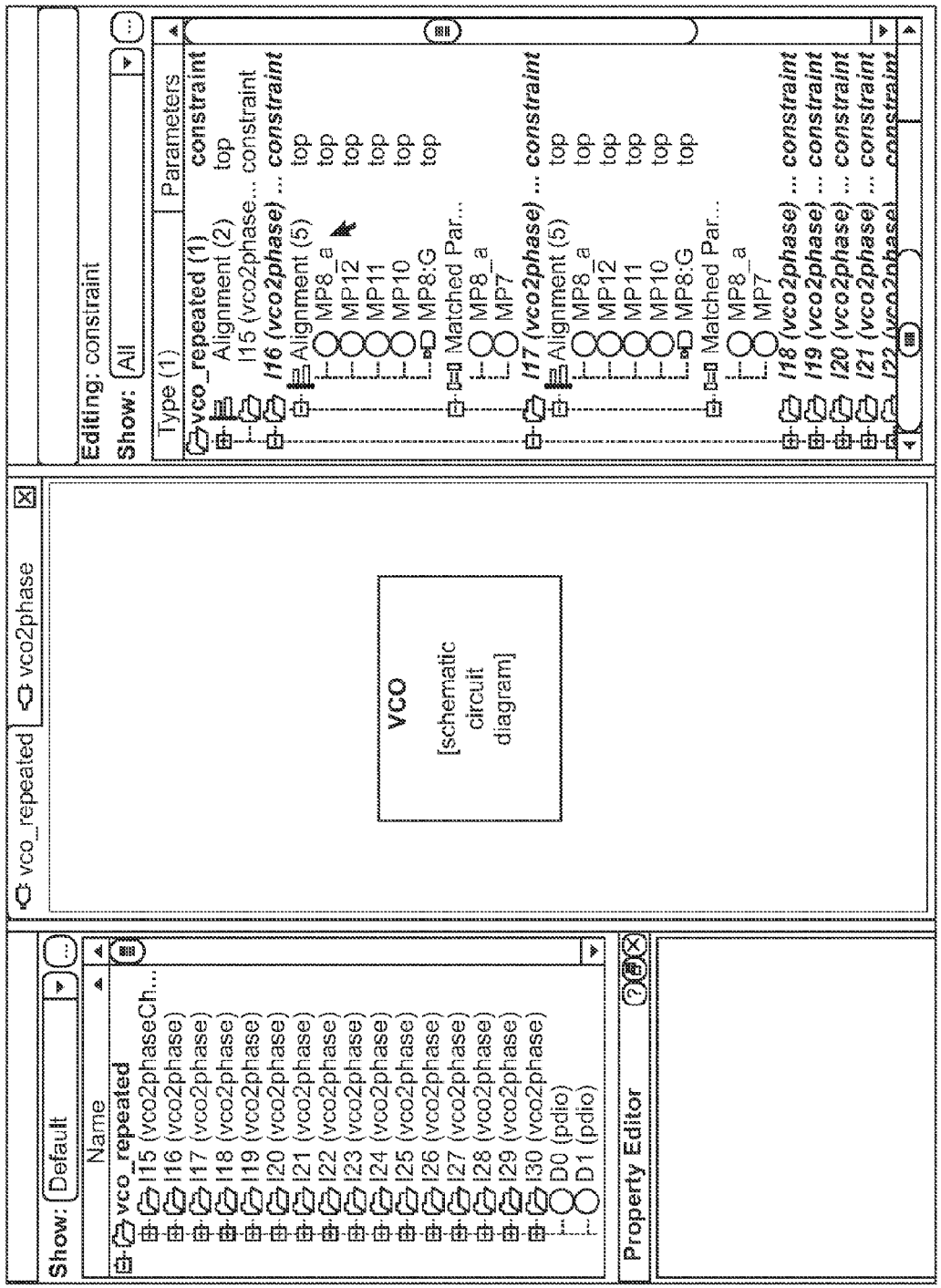

FIGS. 9A-9D are illustrative drawings of computer user interface screen displays before (FIGS. 9A and 9C) and after (FIGS. 9B and 9D) user annotation of a design. FIGS. 9A-9B each show a schematic diagram of a circuit named "vco2phase". FIGS. 9C-9D, show a schematic of the same design except one level above in the design hierarchy in which "vco2phase" is instantiated multiple times. It will be appreciated that the details of the schematic and the hierarchy are unimportant and are not discussed herein. A user selectable menu on the left side of each of FIGS. 9A-9B shows a selection indicia of circuit components within "vco2phase". A user selectable menu on the right side of each of FIGS. 9A-9B shows a menu of indicia of constraints applied to the components listed on the left side. FIG. 9A shows a component named MP8 highlighted in both the left and right side menus. FIG. 9B shows that same component annotated to rename it MP8_a. Thus, the designer "constraint" input in this example is the application of a new name, "MP8_a" to a component of the design shown in FIGS. 9A-9B. It will be appreciated that the right side menus serve as a user interface to associate constraint information with an instance (e.g., MP8 or MP8_a) in a block hierarchy for "vco2phase" that corresponds to selected component in the right side menu. A user selectable menu on the left side of each of FIGS. 9C-9D shows a user selectable menu of indicia of selections, I15-I30, for instances of the "vco2ophase" circuit. A user selectable menu on the right side of each of FIGS. 9C-9D shows a menu to view and apply constraints to component instances within the "vco2ophase" circuit. Instances I16-I22 are visible on the right side. FIG. 9C shows expanded menus for two instances I16 and I17, each showing a indicia of a component named MP8. The screen of FIG. 9D is the same as that of FIG. 9C except that the component MP8 has been renamed MP8_a as a result of the user annotation of the screen of FIG. 9B. It will be appreciated that in some embodiments program portion 202 of the process 200 of FIG. 2 receives constraint information via the right side menus, which serve as a user interface to input a constraint to a selected component (e.g., MP8 or MP8_a) of "vco2phase" and to thereby associate the constraint with an occurrence within a block hierarchy (not shown) that corresponds to "vco2phase". Moreover, it will be appreciated that these screen displays illustrate that a designer's annotation of one instance of "vco2phase" results in the annotation being propagated to every instance of "vco2phase" in the overall design.

Computer System to Run Simulation

FIG. 10 is an illustrative block level diagram of a computer system 1000 that can be programmed to store constraints in association with partial mirrored module hierarchy and to correlate instances associated with the stored constraints in a modified block hierarchy with corresponding instances within an original block hierarchy in accordance with some embodiments of the invention. Computer system 1000 can include one or more processors, such as a processor 1002. Processor 1002 can be implemented using a general or special purpose processing engine such as, for example, a microprocessor, controller or other control logic. In the example illustrated in FIG. 10 processor 1002 is connected to a bus 1004 or other communication medium.

Computing system 1000 also can include a main memory 1006, preferably random access memory (RAM) or other dynamic memory, for storing information and instructions, such as code corresponding to the process 200 to store constraint information in a folded module hierarchy data structure and code corresponding to the process 500 to map a constraint stored in association with a mirrored module hierarchy to a design. Main memory 1006 also may be used for storing the database of designs such as block AB and "vco2phase", for example. Computer system 1000 can likewise include a read only memory ("ROM") or other static storage device coupled to bus 1004 for storing static information and instructions for processor system 1002. Moreover, the main memory 1006 and the persistent storage devices 1008 may store data such as simulation waveforms or design database or a computer program such as an integrated circuit design simulation process, for example.

The persistent storage devices 1008 may include, for example, a media drive 1010 and a storage interface 1012. The media drive 1010 can include a drive or other mechanism to support storage media 1014. For example, a hard disk drive, a floppy disk drive, a magnetic tape drive, an optical disk drive, a CD or DVD drive (R or RW), or other removable or fixed media drive. Storage media 1014, can include, for example, a hard disk, a floppy disk, magnetic tape, optical disk, a CD or DVD, or other fixed or removable medium that is read by and written to by media drive 1010. Information storage mechanism 1008 also may include a storage unit 1016 in communication with interface 1012.

The computer system 1000 also includes a user interface (UI) display unit 1018 that can be used to display user input information such as circuit schematics and constraint information as shown in FIGS. 9A-9D, for example.

In this document, the terms "computer program storage medium" and "computer readable medium" are used to generally refer to media such as, for example, memory 1006, storage devices 1008, a hard disk installed in hard disk drive 1010. These and other various forms of computer useable media may be involved in carrying one or more sequences of one or more instructions to processor 1002 for execution. Such instructions, generally referred to as "computer program code" (which may be grouped in the form of computer programs or other groupings), when executed, enable the computing system 1000 to perform features or functions of the present invention as discussed herein.

The foregoing description and drawings of embodiments in accordance with the present invention are merely illustrative of the principles of the invention. Therefore, it will be understood that various modifications can be made to the embodiments by those skilled in the art without departing from the spirit and scope of the invention, which is defined in the appended claims.

The invention claimed is:
1. A method to produce a persistent representation of an annotation to a circuit design comprising:

providing in a non-transitory computer readable storage medium a first instance of a block hierarchy that corresponds to the circuit design;

displaying in a computer user interface display a first elaborated view of the circuit design that corresponds to the first instance of the block hierarchy;

receiving a user input command to associate the annotation with a leaf instance within the elaborated view of the design;

providing a partial mirrored block hierarchy, in the non-transitory computer readable storage medium, that includes an occurrence that includes the leaf instance and that omits one or more occurrences that are not associated with an annotation; and associating the annotation with the occurrence that includes the leaf instance and that is included in the partial mirrored block hierarchy in the non-transitory computer readable storage medium.

2. The method of claim 1 further including:

providing in the non-transitory computer readable storage medium a folded module hierarchy that unfolds to the first instance of the block hierarchy.

3. The method of claim 1, wherein receiving a user input command includes receiving a command to associate the annotation with more than one leaf instance of the elaborated view of the design.

4. The method of claim 1 further including:

configuring a computer system to execute a process including providing the partial mirrored block hierarchy in the non-transitory computer readable storage medium.

5. The method of claim 1 wherein providing the partial mirrored block hierarchy includes:

creating a mirrored module hierarchy that mirrors a folded module hierarchy that unfolds to instantiate an occurrence within the first instance of the block hierarchy that corresponds to the leaf instance to be associated with the annotation; and transforming the mirrored module hierarchy to the partial mirrored block hierarchy; and storing the partial mirrored block hierarchy in the non-transitory computer readable storage medium.

6. The method of claim 5 further including:

storing the mirrored module hierarchy in the non-transitory computer readable storage medium.

7. The method of claim 5, wherein the mirrored module hierarchy omits a portion of the folded module hierarchy that unfolds to instantiate an occurrence within the first instance of the block hierarchy that does not correspond to the leaf instance to be associated with the annotation.

8. The method of claim 5 further including:

configuring a computer system to execute a process including transforming the mirrored module hierarchy to the partial mirrored block hierarchy.

9. The method of claim 1 further including:

providing in the non-transitory computer readable storage medium a second instance of the block hierarchy corresponding to the design;

mapping the occurrence in the partial mirrored block hierarchy with a corresponding occurrence in the second instance of the block hierarchy; and associating the annotation with the corresponding occurrence in the second instance of the block hierarchy.

10. The method of claim 9 further including:

displaying in a computer user interface display a second elaborated view of the circuit design that corresponds to the second instance of a block hierarchy; and displaying the annotation associated with the leaf instance in the second elaborated view.

11. A method to annotate a circuit design with an annotation comprising:

providing in a non-transitory computer readable storage medium an instance of a block hierarchy that corresponds to the circuit design;

displaying in a computer user interface display an elaborated view of the circuit design that corresponds to the instance of the block hierarchy;

retrieving from the non-transitory computer readable storage medium a partial mirrored block hierarchy that mirrors a portion of the block hierarchy and that includes an occurrence that corresponds to an occurrence within the block hierarchy that is to be associated with the annotation and that omits an occurrence that corresponds to an occurrence within the block hierarchy that is not to be associated with the annotation; and mapping the occurrence in the partial mirrored block hierarchy that is associated with the annotation to a corresponding occurrence in the instance of the block hierarchy.

12. The method of claim 11 further including:

associating the annotation with the occurrence mapped to in the instance of the block hierarchy.

13. The method of claim 12 further including:

displaying indicia of the annotation associated with a component of the elaborated view of the circuit design that corresponds to the occurrence mapped to in the instance of the block hierarchy.

14. The method of claim 11 further including:

configuring a computer system to execute a process including the retrieving.

15. An article of manufacture that includes a computer readable medium that is encoded with a data structure that corresponds to an elaborated circuit design, the data structure comprising:

a block hierarchy that includes occurrences that correspond to components of the circuit design;

a partial mirrored block hierarchy that mirrors a portion of the block hierarchy and that includes an occurrence that corresponds to a first occurrence within the block hierarchy that is to be associated with an annotation and that omits a second occurrence that corresponds to an occurrence within the block hierarchy that is not to be associated with the annotation; and indicia of an association between the first occurrence and the annotation;

wherein the data structure is configured to facilitate an association between the annotation and the first occurrence within the block hierarchy.

16. An article of manufacture that includes a computer readable medium that is encoded with a data structure that corresponds to an elaborated circuit design and that is produced by a process comprising:

providing in a non-transitory computer readable storage medium a block hierarchy that corresponds to the elaborated circuit design;

receiving a user input command to associate an annotation with a leaf instance of the elaborated circuit design;

creating a mirrored module hierarchy that mirrors a folded module hierarchy that unfolds to instantiate an occurrence within the block hierarchy that corresponds to the leaf instance to be associated with the annotation and that omits one or more occurrences that are not associated with an annotation;

transforming the mirrored module hierarchy to a partial mirrored block hierarchy that includes an occurrence that includes the leaf instance and that omits one or more occurrences that are not associated with an annotation;

storing the partial mirrored block hierarchy in the non-transitory computer readable storage medium; and associating the annotation with the occurrence that includes the leaf instance and that is included in the partial mirrored block hierarchy in the non-transitory computer readable storage medium.

17. A computer system to produce a persistent representation of an annotation to a circuit design comprising:

a processor;

a non-transitory computer readable storage medium operatively coupled to the processor, the non-transitory computer readable storage medium encoded with a first instance of a block hierarchy that corresponds to the circuit design;

a user interface display responsive to the processor showing a first elaborated view of the circuit design that corresponds to the first instance of the block hierarchy;

a user input device operatively coupled to the processor to receive command to associate the annotation with a leaf instance of the elaborated view of the design;

wherein the non-transitory computer readable storage medium is operatively coupled to the processor, the non-transitory computer readable storage medium encoded with a partial mirrored block hierarchy that includes an occurrence that includes the leaf instance and that omits one or more occurrences that are not associated with an annotation; and wherein the non-transitory computer readable storage medium includes instructions that, when executed by the processor, cause the processor to associate the annotation with the occurrence that includes the leaf instance and that is included in the partial the mirrored block hierarchy in the non-transitory computer readable storage medium.

18. A computer system to produce a persistent representation of an annotation to a circuit design comprising:

a processor;

a non-transitory computer readable storage medium operatively coupled to the processor, the non-transitory computer readable storage medium encoded with a first instance of a block hierarchy that corresponds to the circuit design;

a user interface display responsive to the processor showing an elaborated view of the circuit design that corresponds to the instance of the block hierarchy;

wherein the non-transitory computer readable storage medium is operatively coupled to the processor, the non-transitory computer readable storage medium encoded with a partial mirrored block hierarchy that mirrors the block hierarchy and that includes an occurrence that corresponds to an occurrence within the block hierarchy that is to be associated with the annotation and that omits an occurrence that corresponds to an occurrence within the block hierarchy that is not to be associated with the annotation; and wherein the non-transitory computer readable storage medium includes instructions that, when executed by the processor, cause the processor to map the occurrence in the partial mirrored block hierarchy that is associated with the annotation to a corresponding occurrence in the instance of the block hierarchy.

19. A method to produce a persistent representation of an annotation to a circuit design comprising:

providing in a non-transitory computer readable storage medium a first instance of a design block hierarchy that corresponds to the circuit design and that includes references to one or more circuit block instances that each references one or more leaf instances;

displaying in a computer user interface display a first elaborated view of the design block hierarchy that corresponds to the circuit design and that represents, for each reference by a circuit block instance to a leaf instance within the design block hierarchy, a corresponding path between a corresponding circuit block instance and a corresponding leaf instance within the elaborated view;

receiving a user input command to associate one or more annotations with one or more leaf instances shown in the elaborated view of the design; and providing a partial mirrored block hierarchy in the non-transitory computer readable storage medium;

wherein the partial mirrored block hierarchy includes each occurrence from within the design block hierarchy that includes a leaf instance indicated by the user input to be associated with one or more annotations; and wherein the partial mirrored block hierarchy omits each occurrence from within the design block hierarchy that does not include a leaf instance indicated by the user input to be associated with one or more annotations; and associating the one or more annotations with the one or more occurrences in the partial mirrored block hierarchy in the non-transitory computer readable storage medium.

20. A method to annotate a circuit design with an annotation comprising:

providing in a non-transitory computer readable storage medium an instance of a design block hierarchy that corresponds to the circuit design;

retrieving from the non-transitory computer readable storage medium a partial mirrored block hierarchy that mirrors the design block hierarchy and that includes an occurrence that corresponds to an occurrence within the design block hierarchy that is to be associated with the annotation and that omits an occurrence that corresponds to an occurrence within the design block hierarchy that is not to be associated with the annotation; and mapping the occurrence in the partial mirrored block hierarchy that is associated with the annotation to a corresponding occurrence in the instance of the design block hierarchy; and displaying in a computer user interface display a first elaborated view of the design block hierarchy that corresponds to the circuit design and that represents, for each reference by a circuit block instance to a leaf instance within the design block hierarchy, a corresponding path between a corresponding circuit block instance and a corresponding leaf instance within the elaborated view and that represents the annotation associated with the mapped to occurrence within the design block hierarchy that is to be associated with the annotation.

21. A computer system to produce a persistent representation of an annotation to a circuit design comprising:

a processor;

a non-transitory computer readable storage medium operatively coupled to the processor, the non-transitory computer readable storage medium encoded with a first instance of a design block hierarchy that corresponds to the circuit design;

a user interface display responsive to the processor showing a first elaborated view of the circuit design that corresponds to the first instance of the design block hierarchy; and a user input device operatively coupled to the processor to receive a command to associate the annotation with a component of the elaborated view of the design;

wherein the non-transitory computer readable storage medium is operatively coupled to the processor, the non-transitory computer readable storage medium encoded with a partial mirrored block hierarchy;

wherein the non-transitory computer readable storage medium includes instructions that, when executed by the processor, cause the processor to associate the annotation with the partial mirrored block hierarchy in the non-transitory computer readable storage medium;

wherein the partial mirrored block hierarchy includes an occurrence from within the design block hierarchy that includes a leaf instance that corresponds to the component indicated by the user input to be associated with the annotation; and wherein the partial mirrored block hierarchy omits an occurrence from within the design block hierarchy that does not include a leaf instance that corresponds to the component indicated by the user input to be associated with the annotation.

* * * * *